(12) United States Patent
Goldbach et al.

(10) Patent No.: US 7,202,535 B2
(45) Date of Patent: Apr. 10, 2007

(54) MANUFACTURING METHOD FOR AN INTEGRATED SEMICONDUCTOR STRUCTURE AND CORRESPONDING INTEGRATED SEMICONDUCTOR STRUCTURE

(75) Inventors: Matthias Goldbach, Dresden (DE); Dongping Wu, Dresden (DE)

(73) Assignee: Infineon Technologies AG, Munich (DE)

( * ) Notice: Subject to any disclaimer, the term of this patent is extended or adjusted under 35 U.S.C. 154(b) by 84 days.

(21) Appl. No.: 11/183,224

(22) Filed: Jul. 14, 2005

(65) Prior Publication Data

US 2007/0015325 A1 Jan. 18, 2007

(51) Int. Cl.
*H01L 29/94* (2006.01)

(52) U.S. Cl. .............. 257/369; 257/310; 257/E27.046; 438/199; 438/216

(58) Field of Classification Search ................. 257/369
See application file for complete search history.

(56) References Cited

U.S. PATENT DOCUMENTS

2005/0275035 A1* 12/2005 Mathew et al. ............. 257/369

* cited by examiner

*Primary Examiner*—Tu-Tu Ho
(74) *Attorney, Agent, or Firm*—Jenkins, Wilson, Taylor & Hunt, P.A.

(57) ABSTRACT

The present invention provides a manufacturing method for an integrated semiconductor structure and a corresponding integrated semiconductor structure. The manufacturing method comprises the steps of: providing a semiconductor substrate (1) having an upper surface (O) and having first and second transistor regions (T1, T2); wherein said first transistor region (T1) is a n-MOSFET region and second transistor region (T2) is a p-MOSFET region; forming a gate structure on said first and second transistor region (T1, T2) including at least one gate dielectric layer (2, 3, 10c, 17, 25) and one gate layer (4; 35; 50, 60) in each of said first and second transistor regions (T1, T2); wherein said gate layer (4; 35; 60) in said second transistor region (T2) is made of negatively doped polysilicon; wherein said at least one gate dielectric layer (2, 10c, 17) in said first transistor region (T1) comprises a first dielectric layer (2, 10c, 17); wherein said at least one gate dielectric layer (2, 3, 10c, 25, 25') in said second transistor region (T2) comprises an interfacial dielectric layer (2; 25; 25') located adjacent to said gate layer (4; 35; 60) in said second transistor region (T2), which interfacial dielectric layer (2; 25; 25') forms an $Al_2O_3$ containing interface on said gate layer (4; 35; 60) in said second transistor region (T2) causing a Fermi-pinning effect; and wherein said first transistor region (T1) does not include said interfacial dielectric layer (2; 25; 25').

14 Claims, 16 Drawing Sheets

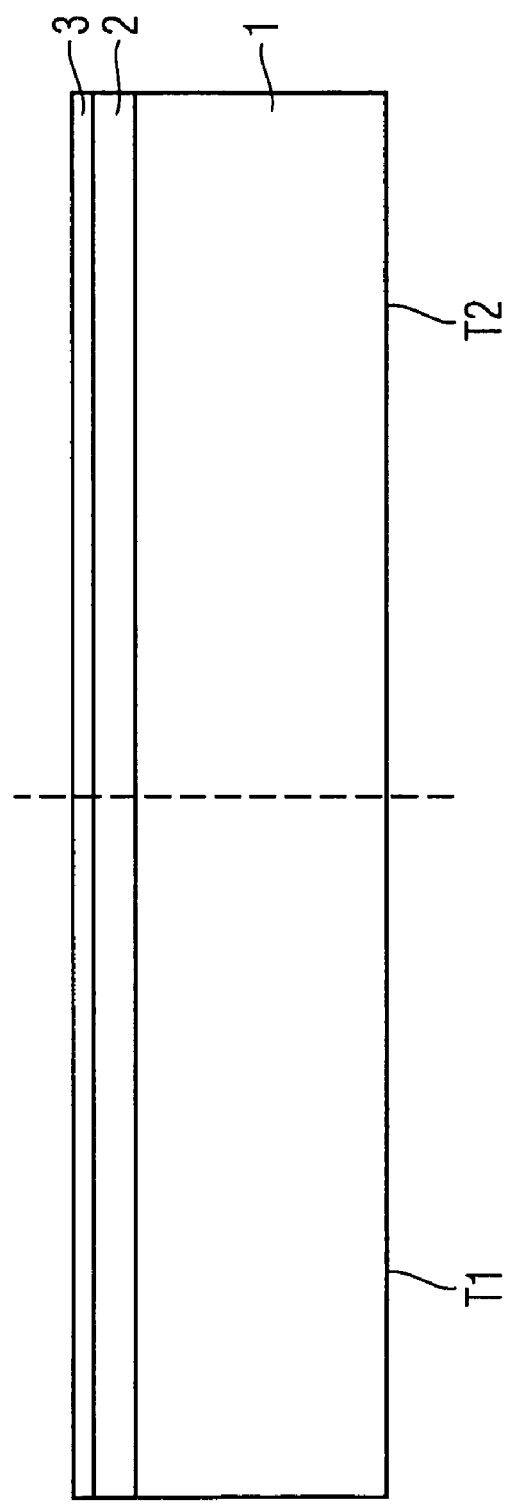

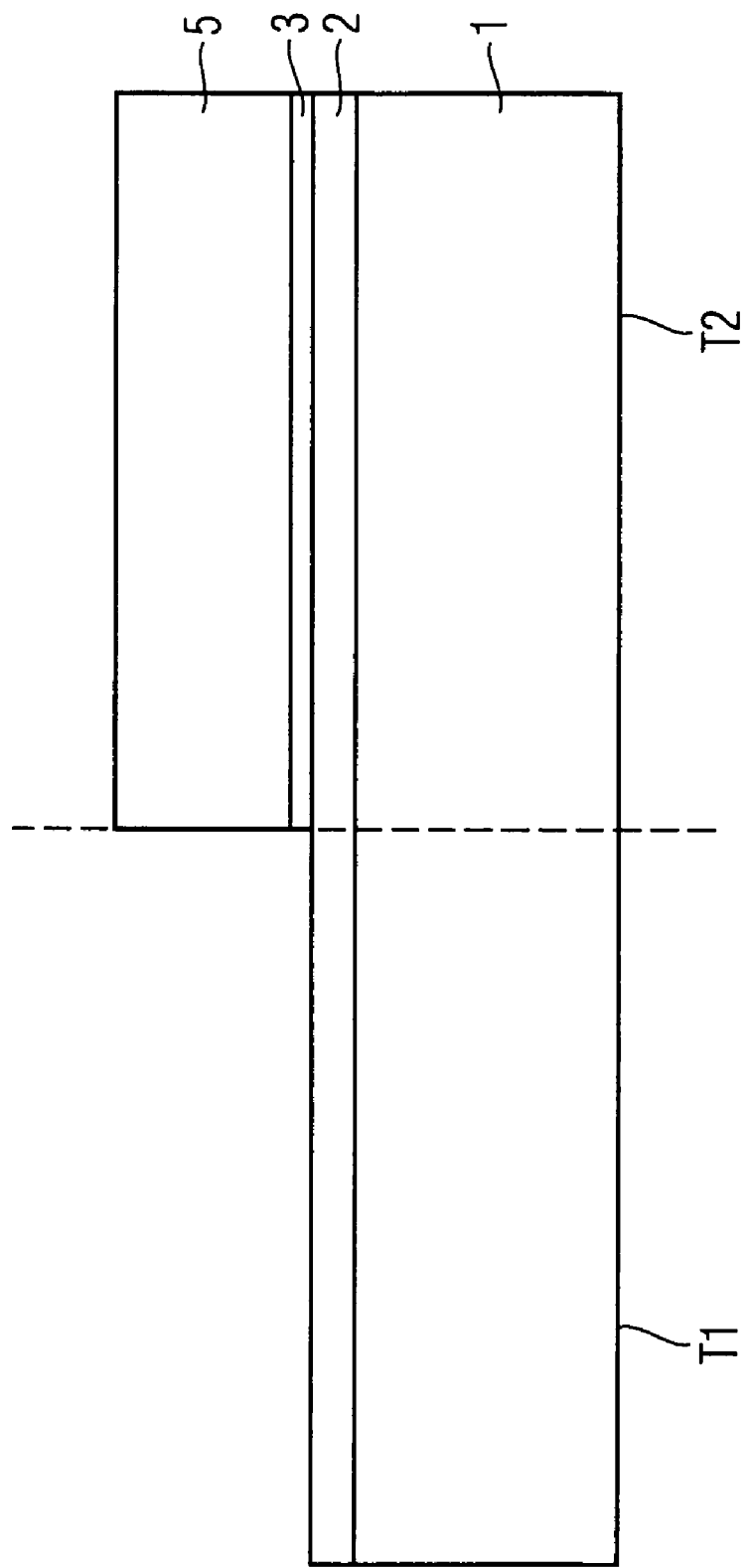

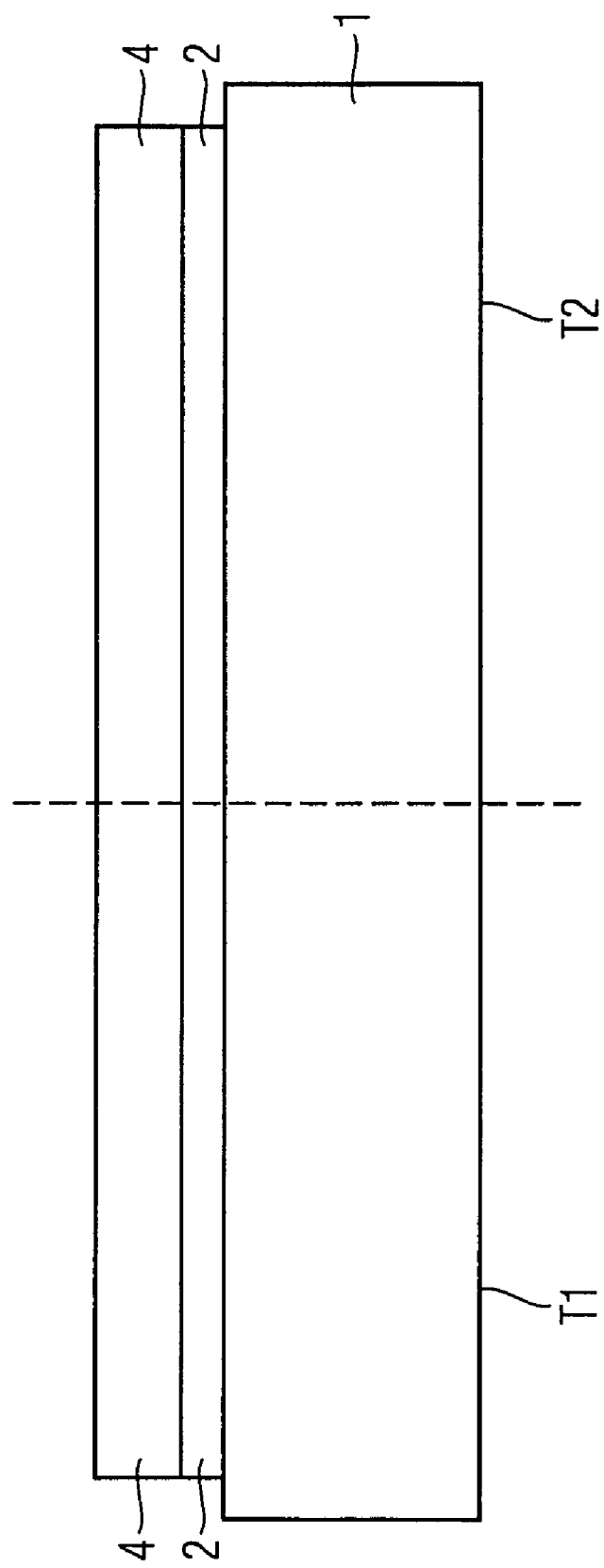

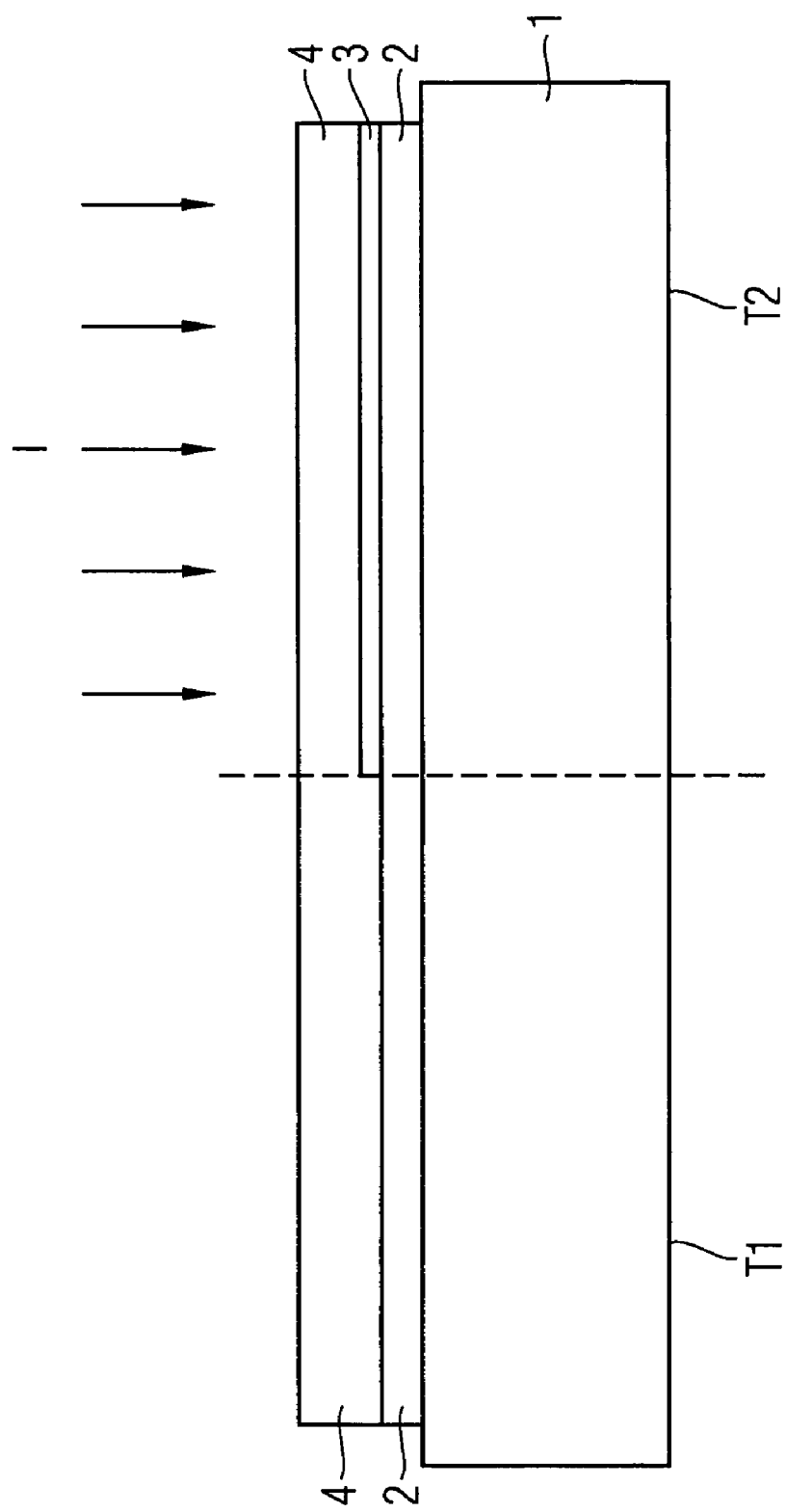

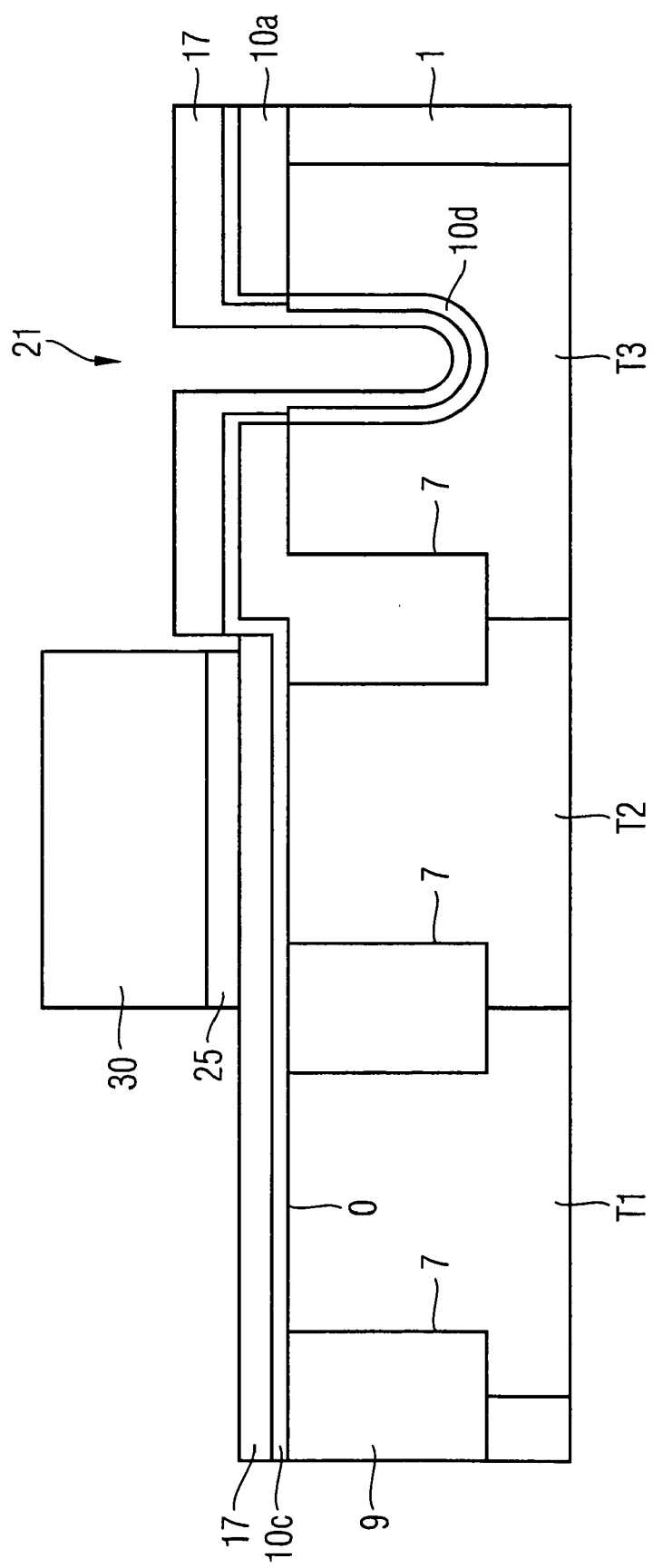

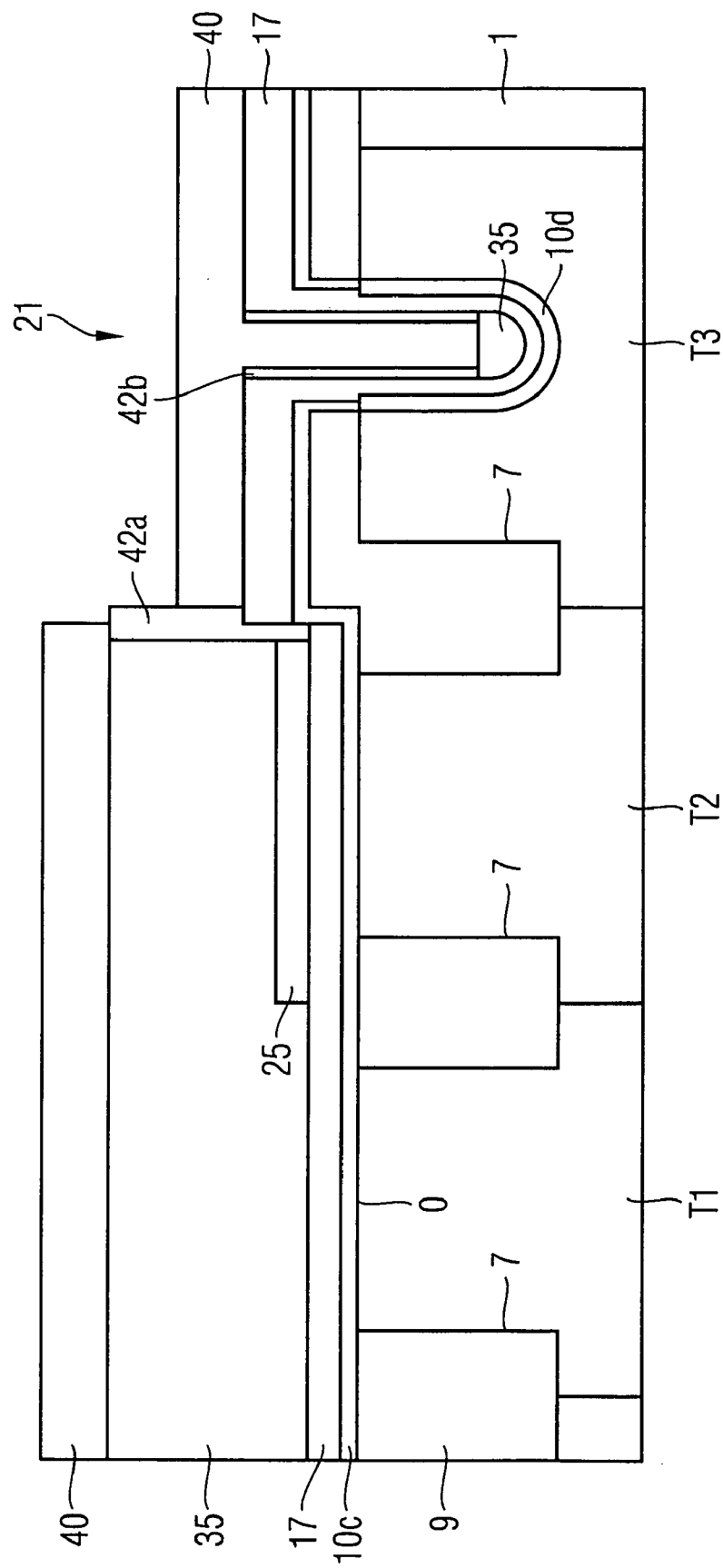

MANUFACTURING METHOD FOR AN INTEGRATED SEMICONDUCTOR STRUCTURE AND CORRESPONDING INTEGRATED SEMICONDUCTOR STRUCTURE

TECHNICAL FIELD

The present invention relates to a manufacturing method for an integrated semiconductor structure and to a corresponding integrated semiconductor structure.

BACKGROUND ART

U.S. Pat. No. 5,843,812 describes a manufacturing process of a p-MOSFET having a polysilicon gate wherein a $BF_2$ ion implantation is performed into said polysilicon gate in order to achieve a more stable threshold voltage.

Although in principle applicable to arbitrary integrated semiconductor structures, the following invention and the underlying problems will be explained with respect to integrated memory circuits in silicon technology.

To improve the speed of the periphery devices, the device length as well as a gate oxide thickness have to be scaled down. Below a certain thickness of 2 nm, the gate leakage is very important and increases exponentially. High-k dielectrics are supposed to improve the gate oxide problem. However, the integration of the high-k dielectric together with a $N^+$ polysilicon gate is very difficult due to the fermi-level pinning.

Also, gate polysilicon depletion is becoming a limiting factor for on-current of small gate-length transistors with a thin gate dielectric having a thickness of less than about 2 nm. The gate poly-depletion effect usually contributes to a $7\text{--}10 \times 10^{-10}$ m (Ångström) increase of the overall effective oxide thickness of the gate dielectric for logic devices. The gate polysilicon depletion is even more severe for p-MOSFETs in DRAM support devices due to the higher boron deactivation during DRAM processing.

Metal gates which are free from poly-depletion effects have been anticipated for replacement of polysilicon gates. However, issues such as a process compatibility, device reliability and difficulties in integrating dual work-function metal gates for both p- and n-MOSFETs have hindered the introduction of metal gates. Though p-MOSFETs with an $N^+$ polysilicon gate are also free from polysilicon depletion effect, the threshold voltage will be too high for any practical application due to the improper work-function of the $N^+$ polysilicon.

SUMMARY OF THE INVENTION

The object of the present invention is to provide an improved manufacturing method for an integrated semiconductor structure and a corresponding integrated semiconductor structure where the Fermi-level of the p-MOSFET may be properly adjusted.

According to the present invention this object is achieved by the manufacturing method of claim 1 and the corresponding integrated semiconductor structure defined in claim 13.

The basic idea underlying the present invention is to enhance p-MOSFET performance by eliminating the gate polysilicon depletion while maintaining the appropriate threshold voltage. An $N^+$ polysilicon gate is used as gate electrode since it is free from gate polysilicon depletion for p-MOSFETs. Moreover, a thin interfacial high-k dielectric layer, preferably an $Al_xO_y$ layer, between the $N^+$ polysilicon gate and the gate dielectric is introduced in the p-MOSFET, only. This interfacial high-k dielectric layer is chosen such that it has strong Fermi-level pinning effects on the $N^+$ gate polysilicon. As a consequence, the effective work-function for the $N^+$ polysilicon is adjusted to a value close to that of a corresponding $P^+$ polysilicon gate. Hence, the threshold voltage of the p-MOSFET can still be controlled in an acceptable range.

Already a very thin $Al_xO_y$ layer (monolayer or several monolayers) results in an insignificant increase of the overall gate dielectric effective thickness due to its relatively high dielectric constant of about 7 to 10.

Moreover, there is a good process compatibility with current Si processing compared with using metal gates. The dual work-function concept is without restrictions of the thermal budget due to boron penetration.

Two general approaches are proposed for the formation of the thin high-k dielectric interfacial layer.

The first approach is to deposit the high-k interfacial dielectric layer on top of the gate dielectric layer and to remove the high-k dielectric layer on top of the n-MOSFET regions by selective wet chemistry.

The other approach is to implant appropriate metal irons into p-MOSFET $N^+$ polysilicon gate areas after the patterning of said areas. Then, a thermal treatment is performed such that metal irons diffuse to the interface between the $N^+$ polysilicon and the gate dielectric where the metal irons will react with gate dielectric ($SiO_2$, $SiO_xN_y$, or a different high-k oxide) and form the desired thin interfacial high-k dielectric layer.

In the dependent claims, advantageous embodiments and improvements of the manufacturing method of claim 1 are listed.

According to a preferred embodiment the step of forming a gate structure on said first and second transistor region includes: forming a first dielectric layer in said first and second transistor region; forming the interfacial dielectric layer in said first and second transistor region above said first dilectric layer; masking said interfacial dielectric layer in said second transistor region; removing said interfacial dielectric layer in said first transistor region; and forming said gate layer in said first and second transistor region.

According to another preferred embodiment the step of forming a gate structure on said first and second transistor region includes: forming a first dielectric layer in said first and second transistor region; forming said gate layer in said first and second transistor region; performing an Al ion implantation into said second transistor region; performing a heat treatment for forming the interfacial dielectric layer in second transistor region above said first dilectric layer.

According to another preferred embodiment said semiconductor substrate is provided having first, second and third transistor regions, said first transistor region being a n-MOSFET region, second transistor region being a p-MOSFET region and said third transistor region being a memory array MOSFET, and wherein at least one second dielectric layer is formed simultaneously in all of said first, second and third transistor regions.

According to another preferred embodiment said second dielectric layer is a high-k dielectric layer made of HfO or HfSiO or HfSiON.

According to another preferred embodiment said interfacial dielectric layer is made of a high-k material such as $Al_xO_y$, $Al_2O_3$ or $HfAl_xO_y$ or any material in combination with $Al_2O_3$ that forms said $Al_2O_3$ containing interface on said gate layer.

According to another preferred embodiment said gate layer in said first and second transistor regions is made of the same material and electrically connected thereby.

According to another preferred embodiment said gate layer in said first and second transistor regions is made of a different material and electrically connected by a gate contact layer.

According to another preferred embodiment said memory array MOSFET is a RCAT device.

Preferred embodiments of the invention are depicted in the drawings and explained in the following description.

BRIEF DESCRIPTION OF THE DRAWINGS

FIGS. 1A,1B show schematic cross-sections of a manufacturing method for an integrated semiconductor structure as a first embodiment of the present invention;

FIGS. 2A,2B show schematic cross-sections of a manufacturing method for an integrated semiconductor structure as a second embodiment of the present invention;

FIGS. 3A–3F show schematic cross-sections of a manufacturing method for an integrated semiconductor structure as a third embodiment of the present invention.

DETAILED DESCRIPTION OF THE INVENTION

Figure 3A:
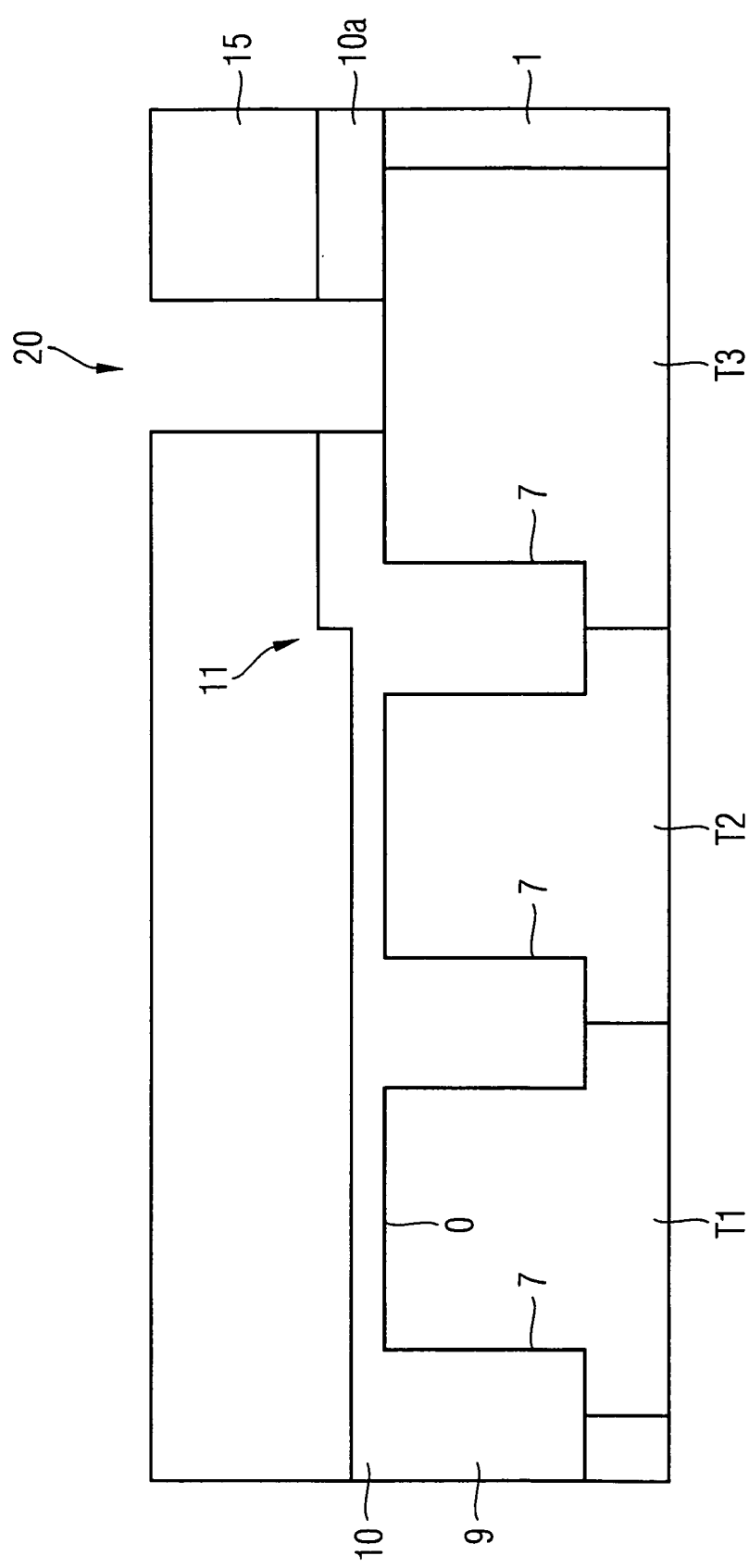

In the Figures, identical reference signs denote equivalent or functionally equivalent components.

FIGS. 1A,B show schematic cross-sections of a manufacturing method for an integrated semiconductor structure as a first embodiment of the present invention.

In FIG. 1, reference sign 1 denotes a silicon semiconductor substrate having a first transistor region T1 as an n-MOSFET region and a second transistor region T2 as a p-MOSFET region. Deposited on top of said substrate 1 there are a base gate dielectric layer 2 of $SiO_2$ and a thin high-k interfacial dielectric layer 3 of $Al_xO_y$. Optionally, a thermal treatment can be applied after having deposited said high-k dielectric layer 3.

With reference to FIG. 1B, the layers 2, 3 in the second transistor region T2, i.e. the p-MOSFET region, are protected with a photoresist region 5. Thereafter, the high-k interfacial dielectric layer 3 is selectively removed from the top of the base dielectric layer 2 in the first transistor region T1, i.e. the n-MOSFET region.

Thereafter, the photoresist region 5 is removed from the second transistor region T2 and a (not shown) $N^+$ gate polysilicon layer is deposited over the first and second transistor regions T1, T2.

Consequently, a semiconductor structure is obtained, wherein p-MOSFETs in the second transistor region T2 may be obtained with a proper work-function and an acceptable value of the threshold voltage.

Simultaneously, n-MOSFET transistors may be obtained in the first transistor region T1 which do not require said additional thin high-k interfacial dielectric layer 3, because an acceptable value of the threshold voltage may be obtained in absence of this high-k dielectric layer 3 by only using said base dielectric layer 2.

FIGS. 2A,B show schematic cross-sections of a manufacturing method for an integrated semiconductor structure as a second embodiment of the present invention.

In the second embodiment shown in FIGS. 2A, 2B, the manufacturing process for obtaining the two transistor regions T1, T2 with different dielectric structures is modified while the finally resulting semiconductor structure is the same as in the first embodiment.

With respect to FIG. 2A, the base dielectric layer 2 of $SiO_2$ is formed on the first and second transistor regions T1, T2. Thereafter, an $N^+$ polysilicon gate layer 4 is deposited and structured on top of the base gate dielectric layer 2.

In the next process step which is illustrated in FIG. 2B, an implantation I of Al ions is performed in the second transistor region T2, only. This may be achieved by appropriately focusing said ion beam or by protecting said first transistor region T1 by means of a (not shown) mask layer.

After a subsequent thermal treatment, Al diffuses into the interface between the base gate dielectric layer in the $N^+$ polysilicon gate layer 4 and reacts with the oxide contained in the base gate electric layer 2 thus forming an interfacial $Al_xO_y$ high-k dielectric layer 3 in said second transistor region T2, only.

Consequently, the same semiconductor structure as in the first embodiment is obtained which has the excellent advantages listed above.

The third and fourth embodiments described below refer to structures having peripheral n-MOSFETs and p-MOSFETs as well as array MOSFETs of RCAT type (recessed channel array transistor).

FIGS. 3A–F show schematic cross-sections of a manufacturing method for an integrated semiconductor structure as a third embodiment of the present invention.

In FIG. 3A, reference sign T1 denotes a first transistor region for N-MOSFETs, T2 a second transistor region for p-MOSFETs, and T3 a third transistor region for array MOSFETs of the RCAT type.

In order to arrive at the process stage shown in FIG. 3A, STI trenches 7 are formed in the silicon semiconductor substrate 1 and filled within an isolating filling 9 of silicon oxide. Then, well and threshold implants are performed in the first, second and third transistor regions T1, T2, T3. A thin sacrificial oxide layer 10 is formed in the first and second transistor regions T1, T2, whereas a thick oxide layer 10a is formed on the upper surface O of the semiconductor substrate in the third transistor region T3. A step between the oxide layers 10 and 10a is denoted with reference sign 11.

Moreover, a photoresist layer 15 is deposited and structured on top of the oxide layers 10, 10a such that an opening 20 is formed in the third transistor region T3. By means of said structured photoresist layer 15 as a mask, the oxide layer 10a is removed in the opening 20 exposing the underlying third transistor region T3.

Figure 3B:
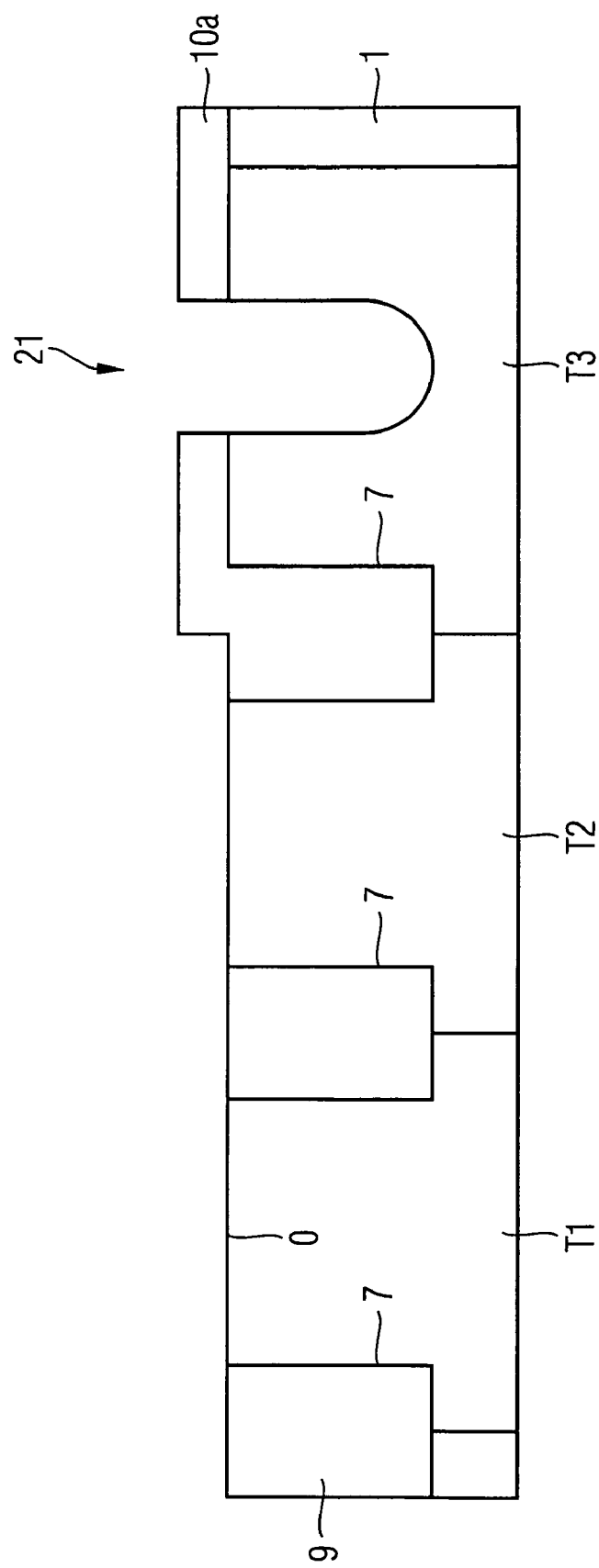

With reference to FIG. 3B, the photoresist layer 15 is stripped, and thereafter a trench 21 for an array MOSFET of RCAT type is formed by a suitable edge using the oxide layers 10, 10a as a mask. Then, the thin sacrificial oxide layer 10 is stripped, in which process step the thick oxide layer 10a is correspondingly thinned.

Figure 3C:
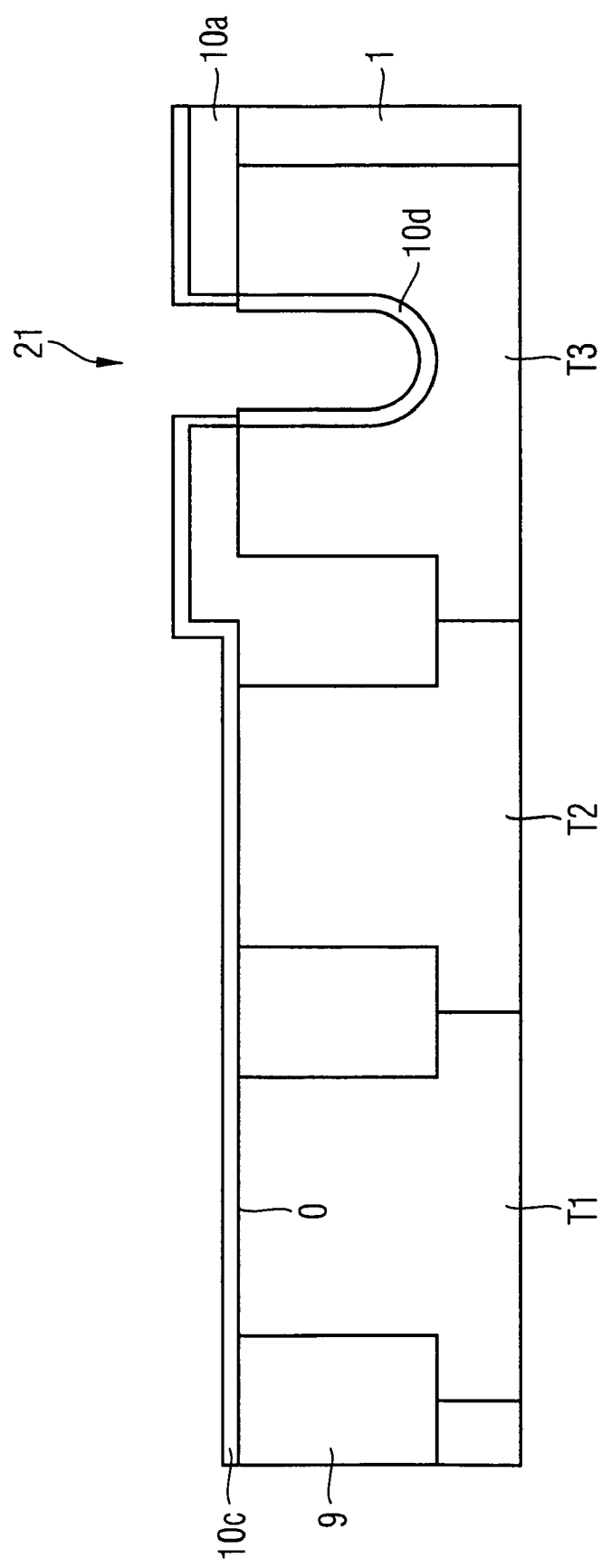

As depicted in FIG. 3C, a thick oxide layer 10d is formed and etched back using a mask for removing it except in the trench 21 for the array MOSFET, said thick oxide layer 10d forming a first dielectric layer for the array MOSFETs to be formed therein. Then, a thin oxide layer 10c is formed in the first and second transistor regions T1, T2 and on top of the oxide layer 10a, said thin oxide layer 10c forming a first dielectric layer for the n- and p-MOSFETs to be formed therein.

According to FIG. 3D, a second dielectric layer 17 made of a high-k dielectric such as HfO or HfSiO or HfSiON is deposited over the first, second and third transistor regions T1, T2, T3. Thereafter, a third dielectric layer 25 is deposited over the first high-k dielectric layer 17, said third dielectric layer 25 being made of a high-k material such as $Al_2O_3$ or $HfAl_xO_y$, or any material in combination with $Al_2O_3$ that forms an $Al_2O_3$ rich interface to polysilicon. The third dielectric layer 25 being made of the high-k material is chosen such that it has strong Fermi-level pinning effects on the later $N^+$ gate polysilicon. As a consequence, the effective work-function for the $N^+$ polysilicon is adjusted to a value close to that of a corresponding $P^+$ polysilicon gate. Hence, the threshold voltage of the p-MOSFET can still be controlled in an acceptable range.

Then, a photoresist layer 30 is deposited and structured over the third dielectric layer 25 such that it protects the second transistor region T2, i.e. the p-MOSFET transistor region. Using said structured photoresist layer 30 as a mask, the third dielectric layer 25 is removed in the first and third transistor regions T1, T3, namely by a selective wet edge process.

Figure 3E:
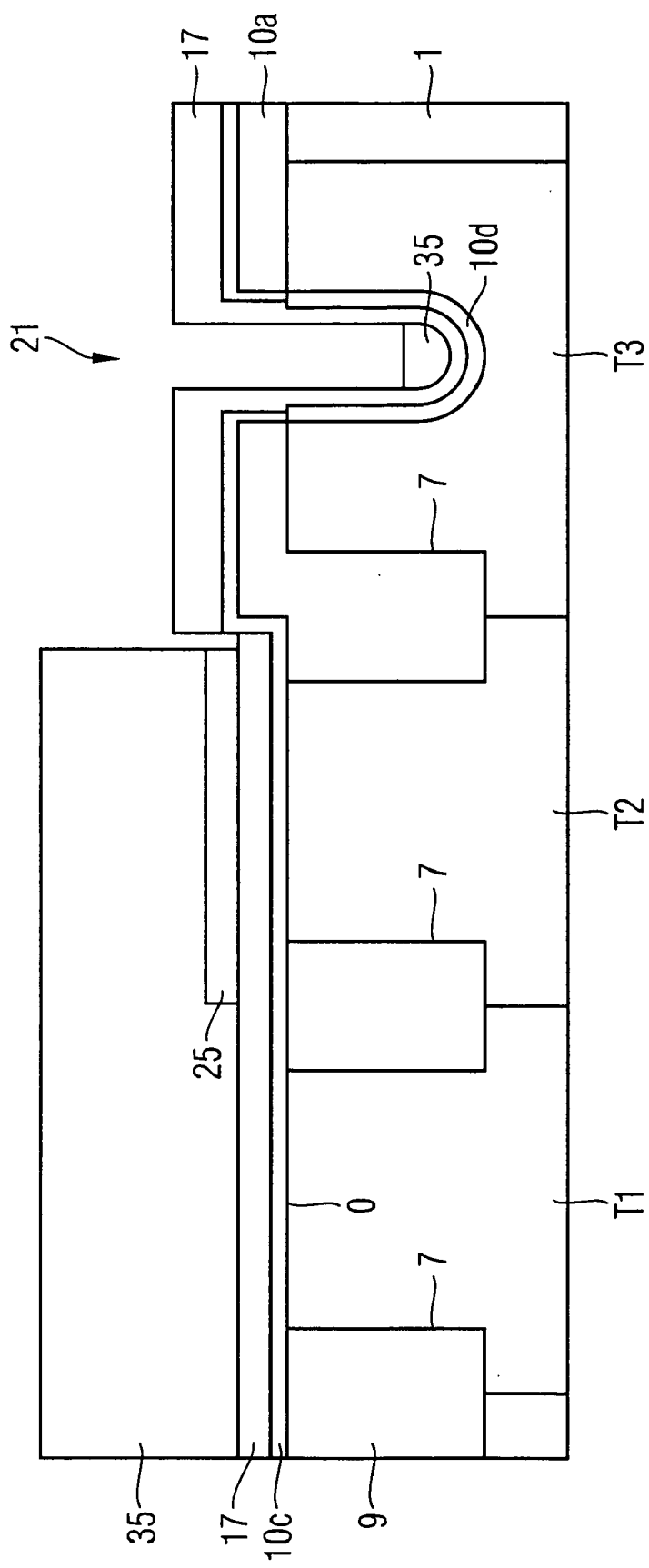

As shown in FIG. 3E, after the removal of the photoresist layer 30, an $N^+$ polysilicon gate layer 35 is deposited and structured such that it only covers the first and second transistor regions T1, T2.

In this process step, the $N^+$ polysilicon gate layer 35 is recessed in the trench 21 for the array MOSFET to a level below the surface O of the semiconductor substrate 1.

For structuring and recessing said $N^+$ polysilicon gate layer 35, a (not shown) photoresist mask may also be used.

With reference to FIG. 3F, another oxide layer 42 is deposited over the first, second and third transistor regions T1, T2, T3 and anisotropically etched resulting in spacers 42a and 42b on the $N^+$ polysilicon gate layer 35 and in the trench 21 for the array MOSFET in the third transistor region T3, respectively.

Finally, a tungsten layer 40 is deposited and structured in order to form a gate contact on top of the $N^+$ polysilicon gate layer 35 in the first, second and third transistor regions T1, T2, T3.

In this example, the $N^+$ polysilicon gate layer 35 connects the gates of the first and second transistor regions T1, T2 which is necessary for the electric performance of the corresponding n- and p-MOSFETs.

FIGS. 4A–F show schematic cross-sections of a manufacturing method for an integrated semiconductor structure as a fourth embodiment of the present invention.

Figure 4A:
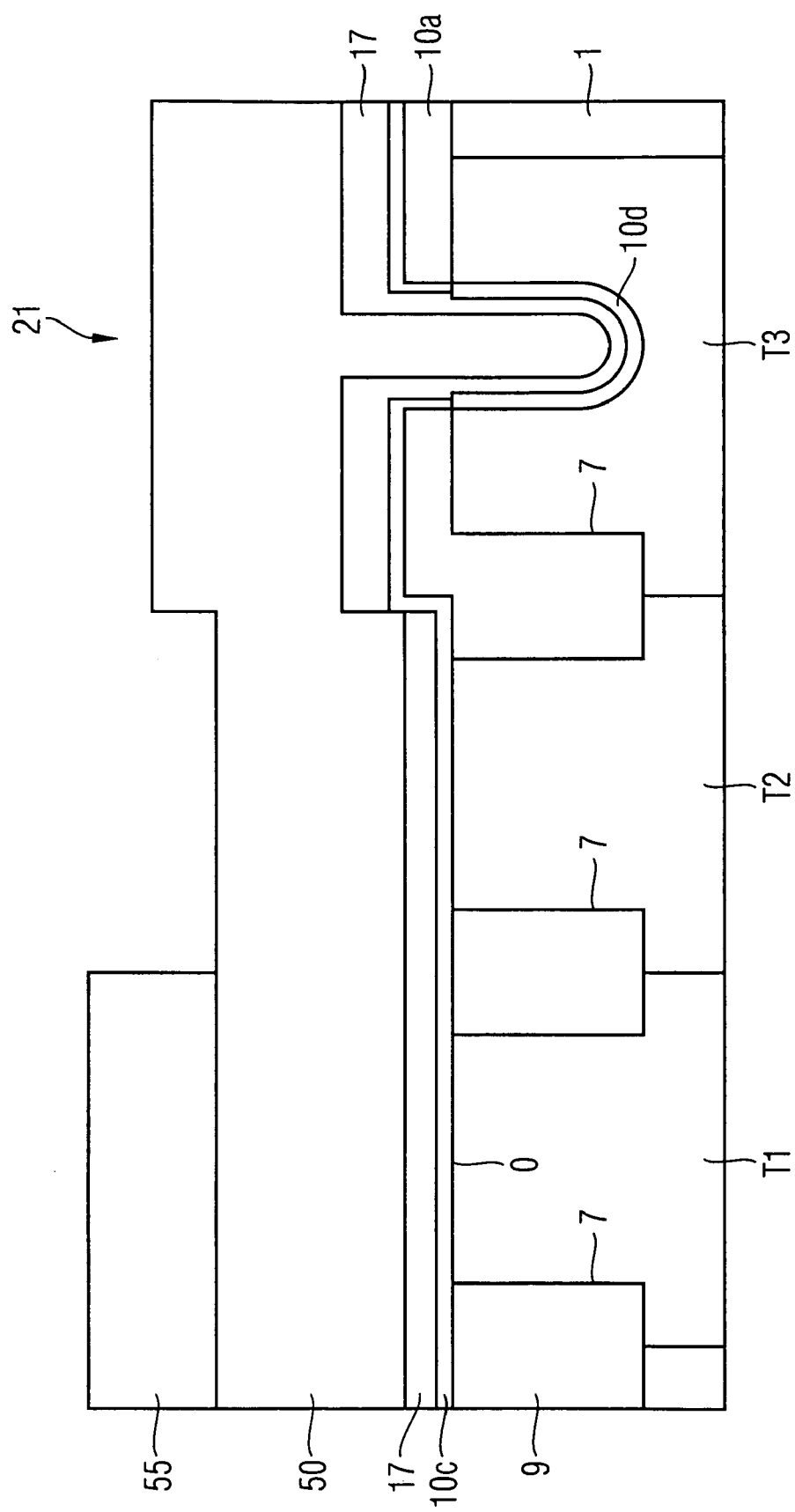
FIGS. 4A–4F show schematic cross-sections of a manufacturing method for an integrated semiconductor structure as a fourth embodiment of the present invention.

The process state shown in FIG. 4A is achieved starting from the process state shown in FIG. 3C, namely after forming the thin and thick oxide layers 10c and 10d, respectively.

The second dielectric layer 17 made of HfO or HfSiO or HfSiON high-k material is deposited over the first, second and third transistor regions T1, T2, T3. Thereafter, an $N^+$ polysilicon gate layer 50 is deposited over the first high-k dielectric layer 17 in the first, second or third transistor regions T1, T2, T3. Then, a photoresist layer 55 is deposited and patterned over the $N^+$ polysilicon gate layer 50 such that it only protects the first transistor region T1, which results in the process state shown in FIG. 4A.

Figure 4B:
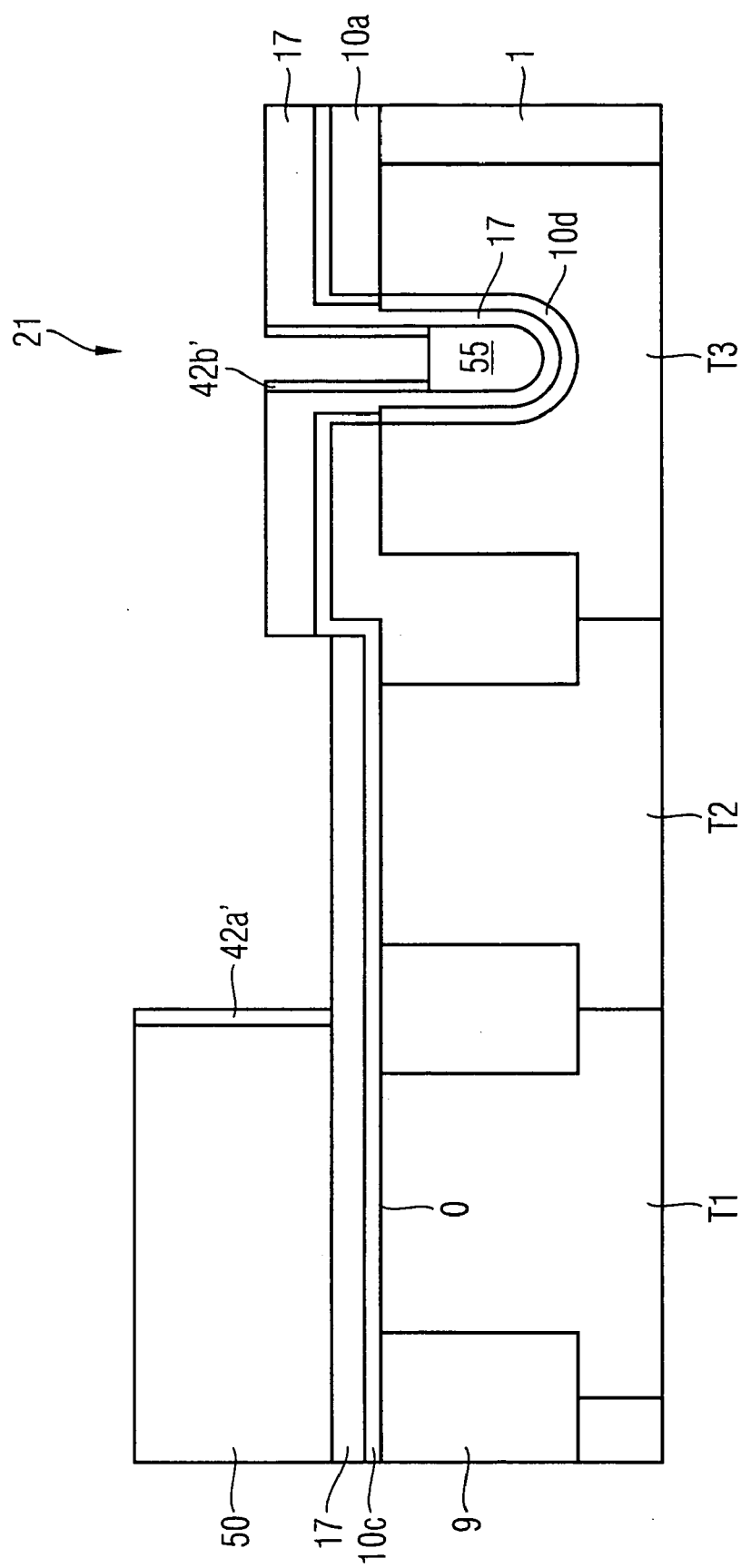

In a following process step shown in FIG. 4B, the $N^+$ polysilicon gate layer 50 is removed from the second transistor region T2 and recessed in the trench 21 for the array MOSFET in the third transistor region T3. Thereafter, the photoresist layer 55 is removed, and another oxide layer is deposited and anisotropically etched back over the structure such that spacers 42a' and 42b' are formed on the remaining $N^+$ polysilicon gate layer 55 and in the trench 21 for the array MOSFET in the third transistor region T3, respectively.

Figure 4C:
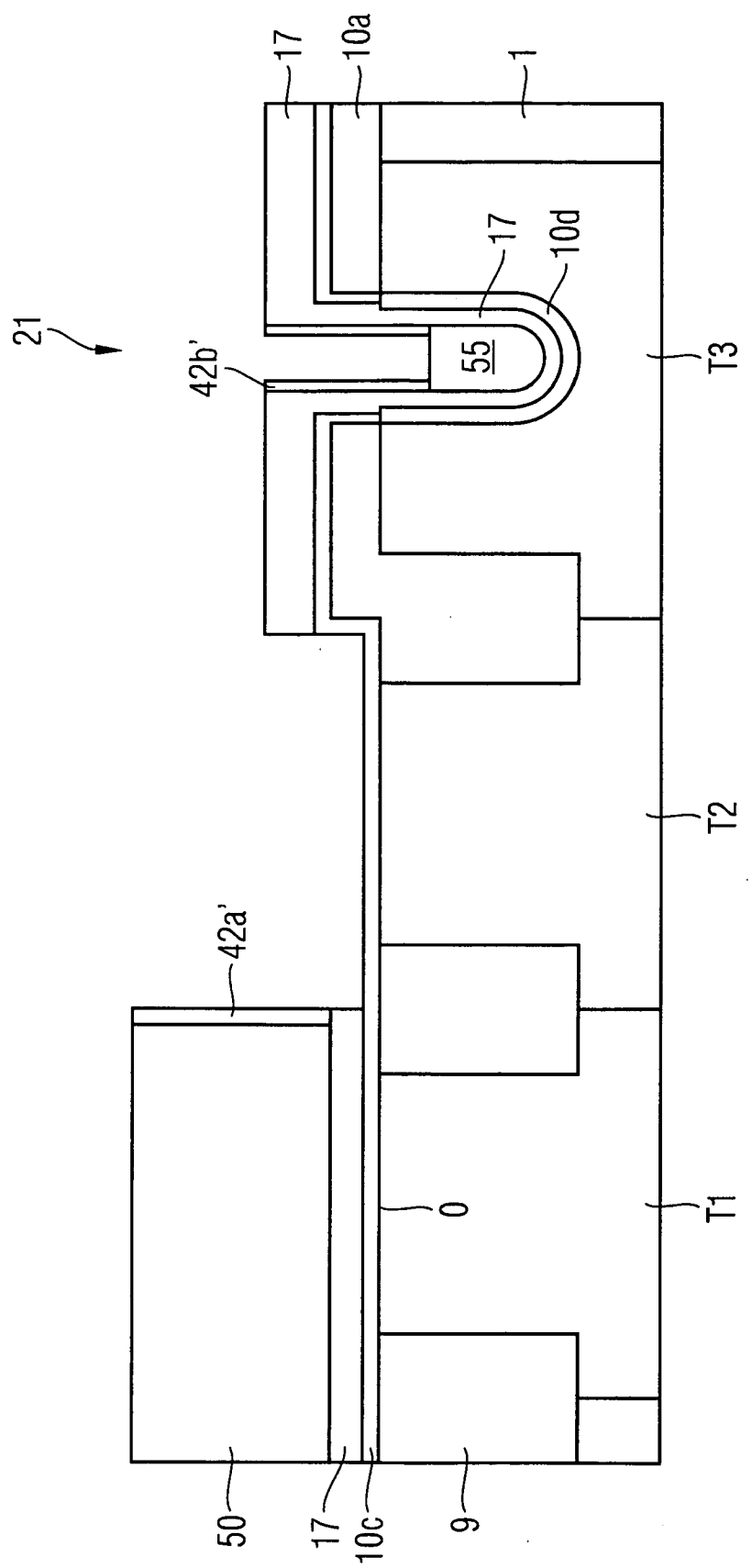

With reference to FIG. 4C, the second dielectric layer 17 is selectively lithographically removed in the second transistor region T2 while the third transistor region T3 is covered with a (not shown) further photoresist mask such that the second dielectric layer 17 is left in the first and third transistor region T3, only, as shown in FIG. 4C. In this process step, also oxide layer 10c is removed and thereafter renewed in the second transistor region T2.

Figure 4D:
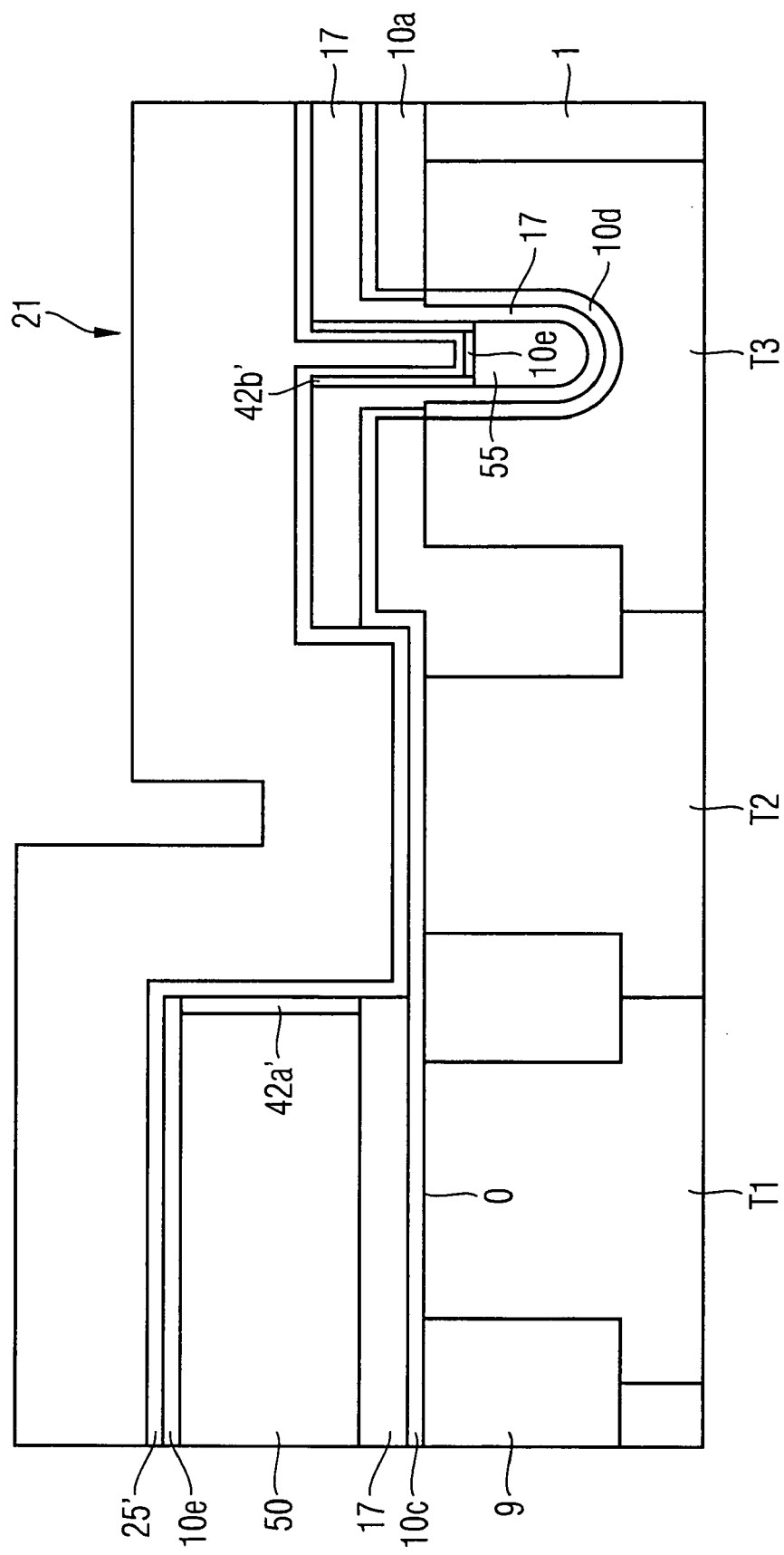

Then, with reference to FIG. 4D, a sacrificial thermal oxide layer 10e is formed on the remaining $N^+$ polysilicon gate layer 55 in the first and third transistor regions T1, T3. Thereafter, a third dielectric layer 25' is deposited over the first, second or third transistor regions T1, T2, T3, said third dielectric layer 25' being made of a high-k material such as $Al_2O_3$ or $HfAl_xO_y$, or any material in combination with $Al_2O_3$ that forms an $Al_2O_3$ rich interface to polysilicon. The third dielectric layer 25 being made of the high-k material is chosen such that it has strong Fermi-level pinning effects on the later $N^+$ gate polysilicon. As a consequence, the effective work-function for the $N^+$ polysilicon is adjusted to a value close to that of a corresponding $P^+$ polysilicon gate. Hence, the threshold voltage of the p-MOSFET can still be controlled in an acceptable range.

Finally, a $N^+$ polysilicon gate layer 60 is formed on the second high-k dielectric layer 25' resulting in the structure shown in FIG. 4D.

Figure 4E:
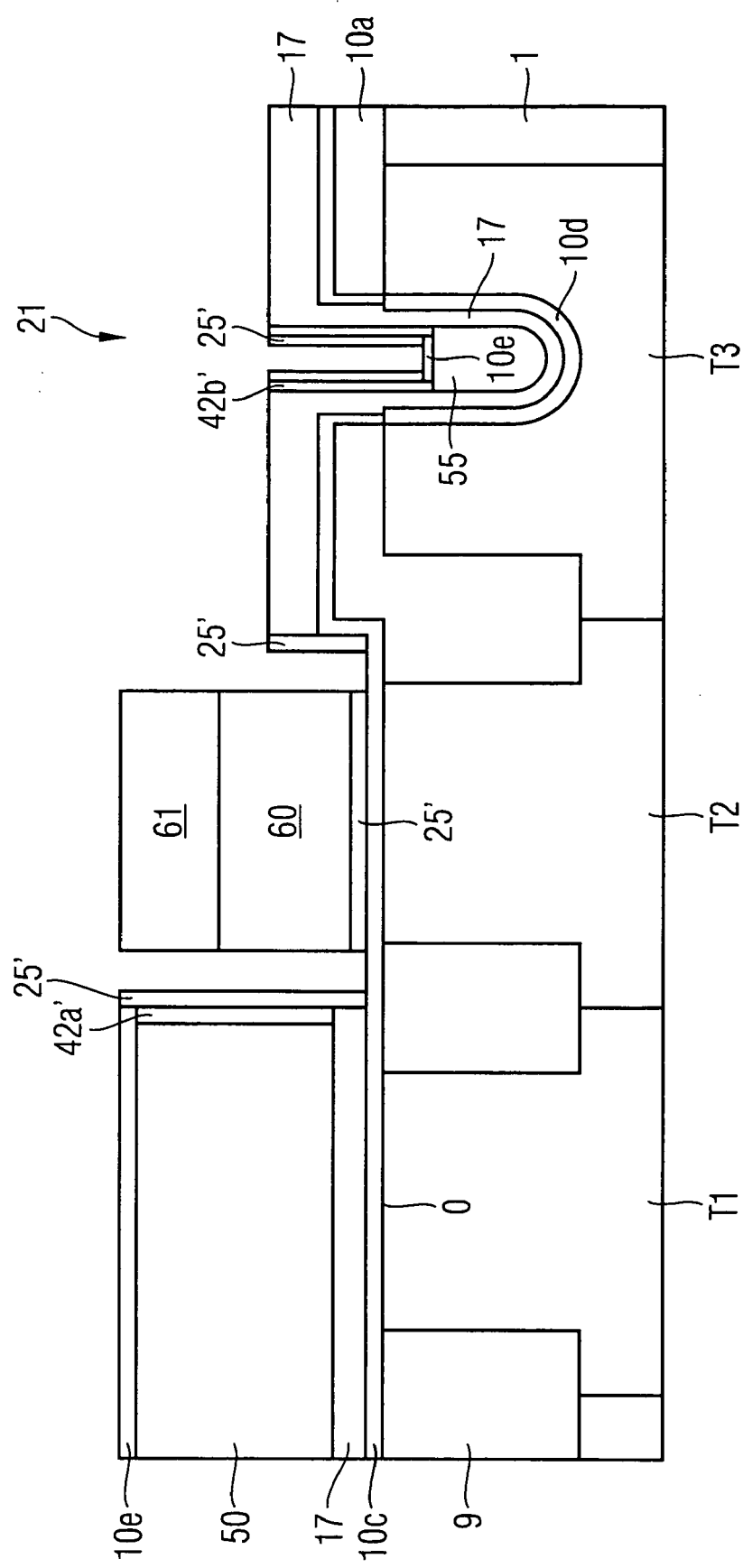
Figure 4F:
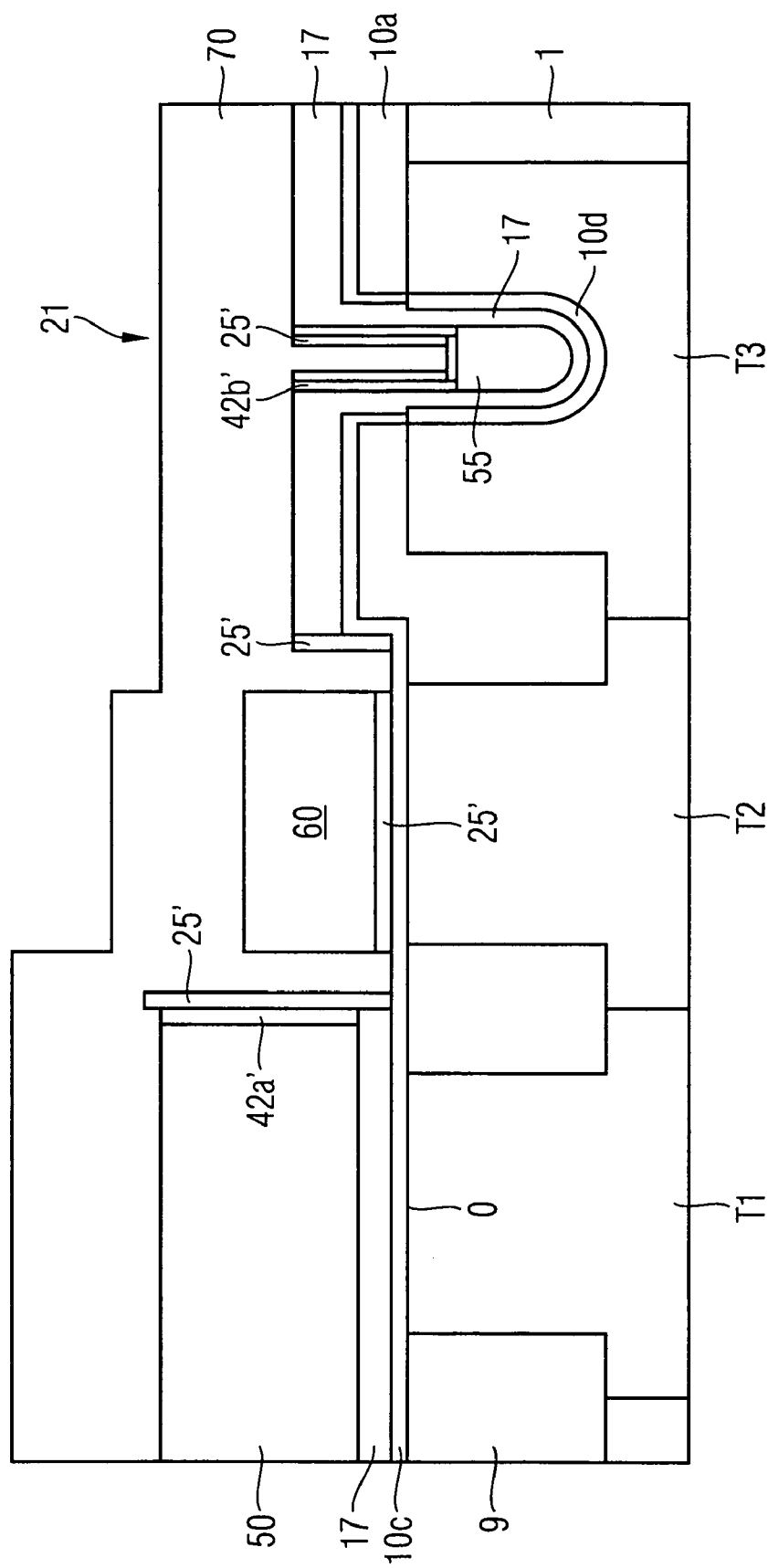

With reference to FIG. 4E, a further photomask 61 is formed and structured such that it only protects the second transistor region T2. Using this photomask 61, the $N^+$ polysilicon gate layer 60 is removed except for the second transistor region T2. This removal is performed by an etching process which stops on the third dielectric layer 25'. In a subsequent anisotropic etch step, the third dielectric layer is removed from the plane surfaces of the exposed plane surfaces of the first, second and third transistor regions T1, T2, T3 such that the third dielectric layer 25' only remains at the vertical surfaces and below the remaining $N^+$ polysilicon gate layer as may be obtained from FIG. 4E. Thereafter, the photoresist mask 61 is stripped from the top of the remaining $N^+$ polysilicon gate layer 60.

Finally, the oxide layer 10e is removed and a tungsten layer 70 is deposited over the entire structure in order to provide gate contacts on the $N^+$ polysilicon gate layers 55 and 60 in the first, second and third transistor regions T1, T2, T3.

In this example, the tungsten layer 70 connects the gates of the first and second transistor regions T1, T2 which is necessary for the electric performance of the corresponding n- and p-MOSFETs.

Although the present invention has been described with respect to two preferred embodiments, it is not limited thereto, but can be modified in various manners which are obvious for the person skilled in the art.

Particularly, the selection of the materials is only an example and can be varied variously.

Especially, the gate structure in the second transistor region may also be formed by a depositing polysilicon on $Al_2O_3$ containing interface, and thereafter performing a full silicidation which leaves an interface polysilicon layer.

Alternatively, the gate structure in the second transistor region may also be formed by a depositing silane on $Al_2O_3$ containing interface to form a polysilicon interface, and thereafter depositing a metal gate layer on top of the interface, f.e. tungsten or TiN.

The invention claimed is:

1. A manufacturing method for an integrated semiconductor structure comprising the steps of:
   (a) providing a semiconductor substrate having an upper surface and having first and second transistor regions; wherein said first transistor region is a n-MOSFET region and second transistor region is a p-MOSFET region; and
   (b) forming a gate structure on said first and second transistor region including at least one gate dielectric layer and one gate layer in each of said first and second transistor regions; wherein said gate layer in said second transistor region is made of negatively doped polysilicon; wherein said at least one gate dielectric layer in said first transistor region comprises a first dielectric layer; wherein said at least one gate dielectric layer in said second transistor region comprises an interfacial dielectric layer located adjacent to said gate layer in said second transistor region, which interfacial dielectric layer forms an $Al_2O_3$ containing interface on said gate layer in said second transistor region causing a Fermi-pinning effect; and wherein said first transistor region does not include said interfacial dielectric layer.

2. The method according to claim 1, wherein the step of forming a gate structure on said first and second transistor region includes:
   (a) forming a first dielectric layer in said first and second transistor region;
   (b) forming the interfacial dielectric layer in said first and second transistor region above said first dilectric layer;
   (c) masking said interfacial dielectric layer in said second transistor region;
   (d) removing said interfacial dielectric layer in said first transistor region; and
   (e) forming said gate layer in said first and second transistor region.

3. The method according to claim 1, wherein the step of forming a gate structure on said first and second transistor region includes:
   (a) forming a first dielectric layer in said first and second transistor region;
   (b) forming said gate layer in said first and second transistor region;
   (c) performing an Al ion implantation into said second transistor region;
   (d) performing a heat treatment for forming the interfacial dielectric layer in second transistor region above said first dilectric layer.

4. The method according to claim 1, wherein said semiconductor substrate is provided having first, second and third transistor regions, said first transistor region being a n-MOSFET region, second transistor region being a p-MOSFET region and said third transistor region being a memory array MOSFET, and wherein at least one second dielectric layer is formed simultaneously in all of said first, second and third transistor regions.

5. The method according to claim 4, wherein said second dielectric layer is a high-k dielectric layer made of HfO or HfSiO or HfSiON.

6. The method according to claim 1, wherein said interfacial dielectric layer is made of a high-k material such as $Al_xO_y$, $Al_2O_3$ or $HfAl_xO_y$ or any material in combination with $Al_2O_3$ that forms said $Al_2O_3$ containing interface on said gate layer.

7. The method according to claim 1, wherein said gate layer in said first and second transistor regions is made of the same material and electrically connected thereby.

8. The method according to claim 1, wherein said gate layer in said first and second transistor regions is made of a different material and electrically connected by a gate contact layer.

9. The method according to claim 4, wherein said memory array MOSFET is a RCAT device.

10. The method according to claim 1, wherein the step of forming a gate structure in the second transistor region includes the steps of depositing polysilicon on $Al_2O_3$ containing interface, and thereafter performing a full silicidation which leaves an interface polysilicon layer.

11. The method according to claim 1, wherein the step of forming a gate structure in the second transistor region includes the steps of depositing silane on $Al_2O_3$ containing interface to form a polysilicon interface, and thereafter depositing a metal gate layer on top of the interface, f.e. tungsten or TiN.

12. The method according to claim 1, wherein the gate structures of the first and second transistor regions are electrically connected to each other.

13. An integrated semiconductor structure comprising a semiconductor substrate having an upper surface and having first and second transistor regions; wherein said first transistor region is a n-MOSFET region and second transistor region is a p-MOSFET region; a gate structure on said first and second transistor region including at least one gate dielectric layer and one gate layer in each of said first and second transistor regions; wherein said gate layer in said second transistor region is made of negatively doped polysilicon; wherein said at least one gate dielectric layer in said first transistor region comprises a first dielectric layer; wherein said at least one gate dielectric layer in said second transistor region comprises an interfacial dielectric layer located adjacent to said gate layer in said second transistor region, which interfacial dielectric layer forms an $Al_2O_3$ containing interface on said gate layer in said second transistor region causing a Fermi-pinning effect; and wherein said first transistor region does not include said interfacial dielectric layer.

14. The integrated semiconductor structure of claim 13, wherein the gate structures of the first and second transistor regions are electrically connected to each other.

* * * * *